United States Patent [19]

De Mari

[11] Patent Number: 4,985,807
[45] Date of Patent: Jan. 15, 1991

[54] ENCODING DEVICE PARTICULARLY FOR INTEGRATED CIRCUIT CARDS

[75] Inventor: Daniel De Mari, Moissac, France

[73] Assignee: APR Composants, Montauban, France

[21] Appl. No.: 401,860

[22] Filed: Sep. 1, 1989

[30] Foreign Application Priority Data

Sep. 2, 1988 [FR] France ............................ 88 11522

[51] Int. Cl.5 ............................................. H01R 9/00
[52] U.S. Cl. ..................................... 361/405; 361/380; 361/410; 361/413
[58] Field of Search ................ 361/352, 380, 392–394, 361/400, 403, 405, 410, 413, 416; 439/188, 189, 507, 510, 516

[56] References Cited

U.S. PATENT DOCUMENTS

| | | | |
|---|---|---|---|
| 3,333,231 | 7/1967 | Travis | 439/516 |
| 4,089,041 | 5/1978 | Lockard | 361/403 |
| 4,090,667 | 5/1978 | Crimmins | 439/516 |
| 4,471,158 | 9/1984 | Roberts | 439/516 |

FOREIGN PATENT DOCUMENTS

| | | |
|---|---|---|
| 0256581 | 2/1988 | European Pat. Off. . |
| 3306120 | 8/1984 | Fed. Rep. of Germany . |
| 1309979 | 10/1962 | France . |
| 1491397 | 8/1967 | France . |
| 2137991 | 12/1972 | France . |
| 2243580 | 4/1975 | France . |
| 1447070 | 8/1976 | United Kingdom . |

Primary Examiner—Gregory D. Thompson
Attorney, Agent, or Firm—Kenyon & Kenyon

[57] ABSTRACT

An encoding device, particularly for use with integrated circuit cards, includes a plurality of electrically conducting elements, each connecting at least two points of a printed circuit and adapted to be interrupted between these two points so as to establish a digital code condition according to whether they are interrupted or not interrupted. A plurality of conductor elements are incorporated in a body made from an electrically insulating material in a way to form an encoding component. The body includes a cutout, corresponding to each conducting element, being opened towards an exterior of the component and traversed by the corresponding conducting element thus the exterior accessible portion of this element forms a rupture zone allowing the programming of the element.

6 Claims, 1 Drawing Sheet

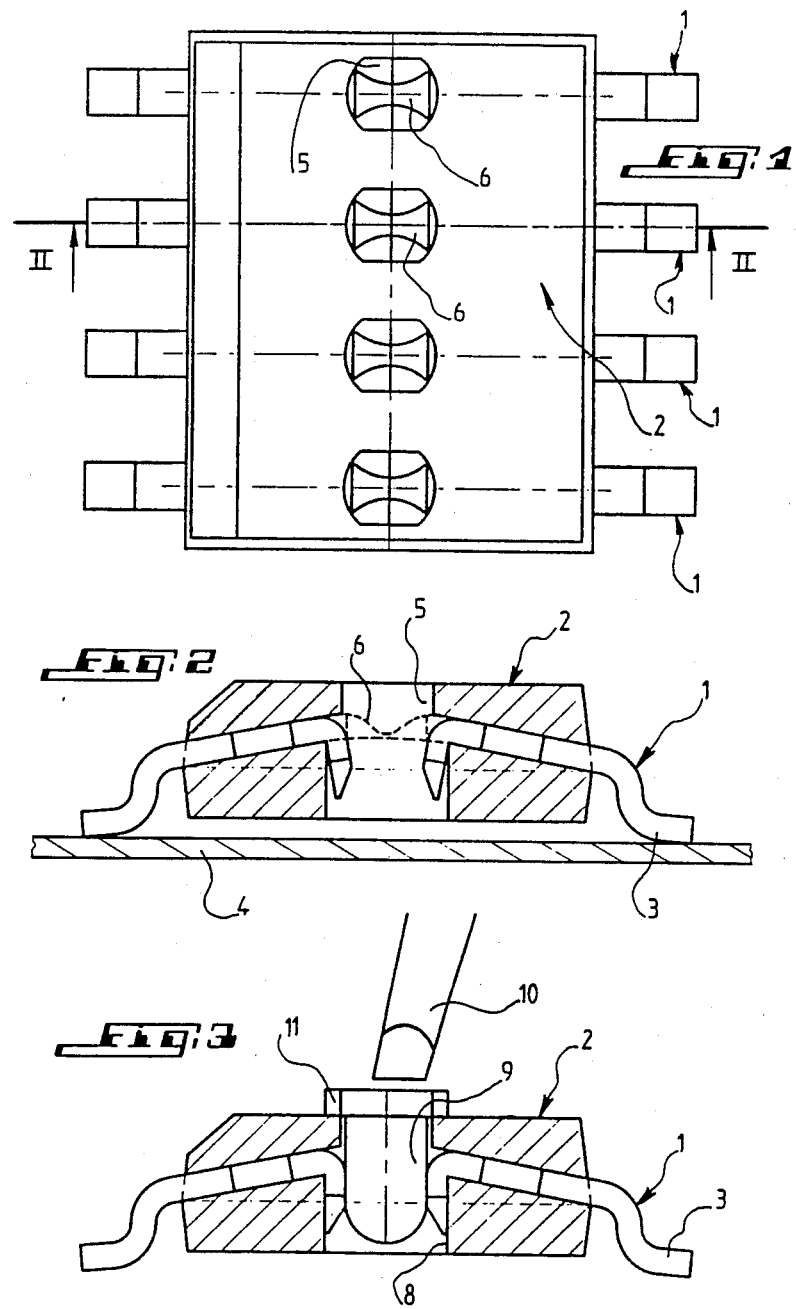

ENCODING DEVICE PARTICULARLY FOR INTEGRATED CIRCUIT CARDS

BACKGROUND OF THE INVENTION

The present invention relates to an encoding device particularly for integrated circuit cards, comprising including a plurality of electrically conducting elements which each connect two points of a printed circuit and are adapted to be interrupted or cut between these two points in order to define a digital code condition by their interrupted or non-interrupted state.

Encoding devices are already known where each conductor element is formed by a conductor bridge the ends of which are engaged in holes formed in the card. These known encoding devices have the great shortcoming that to establish the code necessitates the presence of holes in the card, which constitutes an inconvenience for a high density setting of the different electric or electronic components of the electric circuits. Furthermore, these coding elements are not easily reprogrammable.

SUMMARY OF THE INVENTION

The object of the present invention is to overcome the present shortcomings of the known coding devices.

For this purpose, a coding device of the invention are is characterized in that a plurality of conductor elements is incorporated in one and the same body made from an electrically insulating material in a manner to form an encoding component, so that the body comprises for each element a cutout which is open towards the exterior and transversed by said element and in that the portion thus accessible from the exterior of this element comprises a rupture zone allowing the programming of the element.

According to an advantageous feature of the present invention, a conductor element which has been cut can be closed by putting in the corresponding cutout between the two separated ends of a conductor member such as a contact block or plug.

According to another advantageous feature of the present invention, the surfaces of the ends of the contact block which are adapted to come into contact with one another are tinned for facilitating a connection by welding.

According to another feature of the present invention, the welding is accomplished by means of a soldering iron applied to the external end of the contact block.

According to another advantageous feature of the present invention, the cutouts are constituted by passageways which transverse the body of the component from the top to the bottom and have below the conductor elements a greater width than above them so as to cause a downward folding of the conductor elements at their rupture.

According to still another advantageous feature of the present invention, an encoding component is formed by a chip, the external contact pins of which are bent back in the portion by which they are secured to the card so as to allow the assembly of a component by simply placing it on the surface of the card.

BRIEF DESCRIPTION OF THE DRAWINGS

The invention will be better understood and further objects, characterizing features, details and advantages thereof will appear more clearly at the following explanatory description referring to the schematic drawings given only as non-limiting examples of an embodiment of the present invention, wherein:

the FIG. 1 is a top view of an encoding device according to the present invention;

the FIG. 2 is a sectional view along the line II—II of the FIG. 1; and the FIG. 3 is a sectional view similar to the one of the FIG. 2 where the conductor element has been closed by means of a contact block.

DETAILED DESCRIPTION OF THE PRESENT INVENTION

As an results from the Figures, an encoding device according to the invention is realized as encoding component and more particularly as an encoding chip. Each component comprises a certain number of electrically conducting elements 1, each having the shape of an oblong blade. In he embodiment shown on the FIG. 1, the component comprises four conductor elements 1 which are incorporated or integrated in a common body 2 made from an electrically insulating material. It can be seen that each encoding blade 1 extends completely through the body 2 and that the end portions 3 are free and bent in a way to form contact pins allowing the assembly of the component on the plate 4 schematically shown in FIG. 2 by flatly placing it on the plate surface, for instance on the upper surface, due to the fact that the ends of the contact pins extend in parallel relationship to the surface of the plate 4.

The body 2 comprises, in the region of the central portion of each conductor element, a cutout 5 which is constituted in the shown embodiment by a passageway tranversing completely the body from the top to the bottom. Each conductor element extends through this cutout 5. It can be seen that the portion thus disengaged and accessible from the exterior, of the element 1, is realized so as to form a rupture zone 6 indicated by interrupted lines on the FIG. 2. Thus, this element due to its interrupted or not interrupted state determines a digital condition. Accordingly, each conductor element forms an encoding element.

The FIGS. 2 and 3 illustrate further that a passageway like cutout 5 has a greater width in the longitudinal direction of the element 1 in its portion 7 located beneath the latter than in its portion above it. These measures allow to obtain that the encoding element after its rupture can be bent resiliently downwardly as is illustrated on the FIG. 2.

An encoding element according to the invention which has been cut or interrupted, can be closed again and thus easily reprogrammed. The FIG. 3 shows that it is sufficient to this purpose to put in the passageway 5, between the separated ends, a conductor member such as a contact block or plug 9. The joint or connection between the two separated parts of the element 1 and the block 9 is advantageously accomplished by welding. To this end, the surfaces of the separated parts of the element 1 and of the block 9 which are adapted to come into contact with one another are tinned and the welding is accomplished by applying, for instance, a soldering iron 10 on the external end of the block 9. It is to be noted that this end is shaped to form a head 11 enabling the block to be supported on the upper surface of the body 2.

It is obvious that the encoding component of the present invention can be modified along numerous manners without departing from the scope of the present invention. Thus, the shape of the conductor elements and of the body 2 can be different. The cutouts 5 and the rupture zones 6 may have any other appropriate shape. The contact block can also be of any other type allowing to close again or reconnect the two parts of the encoding element after a rupture.

The encoding device according to the present invention having the shape of an encoding chip may for instance have two, four, six, eight or more poles. The distance between adjacent poles is not dependent on the distance of the holes in the integrated circuit card. The distance or pitch may advantageously be of 1.27 mm. The encoding chip according to the invention is juxtaposable at a pitch of 0.27 mm. But pitches of 2.54 mm, usual in CMS technology, are also possible.

What is claimed is:

1. An encoding device, particularly for printed circuit cards, comprising a plurality of electrically conducting elements each adapted to connect at least two points of a printed circuit and adapted to be interrupted between these two points so as to establish a digital code condition according to whether said conducting elements are interrupted or not interrupted, said plurality of conducting elements being incorporated in a body made from an electrically insulating material so as to form a single encoding component, said insulating material body comprising, for each of said conducting elements, a corresponding cutout opening towards an exterior of the encoding component and traversed by said each corresponding conducting element and through which a first portion of said each corresponding conducting element is accessible from said corresponding exterior, said first portion of said each corresponding conducting element comprising a rupture zone allowing a rupture of said corresponding conducting element for programming said conducting element, wherein a conducting element which has been interrupted in said rupture zone and comprises two end portions separated from one another by said interruption, is adapted to be closed by introducing into said corresponding cutout opening, between said separated two end portions, an electrically conducting contact block said electrically conducting block including a head by which said conducting block is supported on an upper surface of said electrically insulating material body.

2. The encoding device of claim 1, wherein each said corresponding cutout opening comprises a passage way which traverses completely said insulating material body from its top to its bottom, said corresponding conducting element traversing said corresponding cutout opening wherein said corresponding cutout opening has first and second portions located respectively above and beneath said corresponding conductor element traversing said corresponding cutout opening, said first and second portions having a first and a second substantially constant width, respectively, said second width of said second portion beneath said corresponding conducting element being greater than the first width of said first portion above said corresponding conducting element, wherein said separated end portions of a ruptured conducting element are bent back in the downward direction against the walls of said second portion of said corresponding cutout opening.

3. The encoding device of claim 1, wherein said encoding component comprises, for each conducting element, two external contact pins, each pin having an outer end portion by which it is secured to a printed circuit card, wherein said outer end portion of each of said pins is bent so as to extend substantially in parallel relationship to a surface of the card, said encoding component being secured to the card by simply placing it on the card surface, with the bent outer end portions of each of said pins being flatly placed on the card surface.

4. The device according to claim 3, wherein said pins are formed by the ends of said conductor elements, which extend from said body of electrically insulating material.

5. The device according to claim 1, wherein the introduced conductor block can be connected to the separated ends of a conductor element by welding.

6. The device according to claim 4, wherein faces of the ends of a conductor element and of a corresponding conducting block which are adapted to come in contact with one another, are tinned so as to facilitate a connection by welding with a soldering iron applied on said head of said conducting block.

* * * * *

UNITED STATES PATENT AND TRADEMARK OFFICE
CERTIFICATE OF CORRECTION

PATENT NO. : 4,985,807
DATED : 15 January 1991
INVENTOR(S) : Daniel DE MARI It is certified that error appears in the above-identified patent and that said Letters Patent is hereby corrected as shown below:

| Column | Line | |
|--------|------|---|
| 1 | 7 | After "cards," delete "comprising". |
| 1 | 27 | Before "invention" insert --present--; after "invention" delete "are". |
| 2 | 13 | Before "results" delete "an". |
| 2 | 14 | Before "enconding" insert --an--. |
| 2 | 18 | After "In" change "he" to --the--. |
| 3 | 33 | After "said" delete "corresponding". |
| 3 | 37 | Before "conducting" insert --corresponding--. |

Signed and Sealed this

Fourth Day of August, 1992

Attest:

DOUGLAS B. COMER

Attesting Officer     Acting Commissioner of Patents and Trademarks